(12) United States Patent
Sumitomo et al.

(10) Patent No.: US 8,284,811 B2
(45) Date of Patent: Oct. 9, 2012

(54) GALLIUM NITRIDE-BASED SEMICONDUCTOR LASER DIODE

(75) Inventors: Takamichi Sumitomo, Itami (JP); Yohei Enya, Itami (JP); Yusuke Yoshizumi, Itami (JP); Masaki Ueno, Itami (JP); Katsushi Akita, Itami (JP); Takashi Kyono, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 166 days.

(21) Appl. No.: 12/837,143

(22) Filed: Jul. 15, 2010

(65) Prior Publication Data

US 2011/0013657 A1   Jan. 20, 2011

(30) Foreign Application Priority Data

Jul. 15, 2009   (JP) ................. P2009-167093

(51) Int. Cl.
*H01S 5/00*   (2006.01)
(52) U.S. Cl. .............. 372/44.011; 372/43.01; 372/45.01
(58) Field of Classification Search ............... 372/43.01, 372/45.01, 44.011
See application file for complete search history.

(56) References Cited

U.S. PATENT DOCUMENTS

| | | | |
|---|---|---|---|
| 2002/0031153 A1 | 3/2002 | Niwa et al. | |
| 2002/0053676 A1 | 5/2002 | Kozaki | |
| 2003/0205783 A1* | 11/2003 | Ishida | 257/627 |
| 2004/0056242 A1 | 3/2004 | Ohno et al. | |
| 2005/0224783 A1 | 10/2005 | Matsuyama et al. | |
| 2007/0290230 A1 | 12/2007 | Kawaguchi et al. | |
| 2008/0056322 A1 | 3/2008 | Masui et al. | |

(Continued)

FOREIGN PATENT DOCUMENTS

EP   1 583 190 A1   10/2005

(Continued)

OTHER PUBLICATIONS

Tyagi et al. "Stimulated Emission at Blue-Green (480 nm) and Green (514 nm) Wavelengths from Nonpolar (m-plane) and Semipolar (11-22) InGaN Multiple Quantum Well Laser Diode Structures," Applied Physics Express, vol. 1, No. 9, pp. 091103-1-091103-3, (Sep. 2008).

*Primary Examiner* — Yuanda Zhang
(74) *Attorney, Agent, or Firm* — Venable LLP; Michael A. Sartori

(57) ABSTRACT

Provided is a III-nitride semiconductor laser diode capable of lasing to emit light of not less than 500 nm with use of a semipolar plane. Since an active layer 29 is provided so as to generate light at the wavelength of not less than 500 nm, the wavelength of light to be confined into a core semiconductor region 19 is a long wavelength. A first optical guide layer 27 is provided with a two-layer structure, and a second optical guide layer 31 is provided with a two-layer structure. A material of a cladding layer 21 comprised of at least either of AlGaN and InAlGaN is different from the III-nitride semiconductor, and the thickness D15 of a first epitaxial semiconductor region 15 is larger than the thickness D19 of the core semiconductor region 19; however, the misfit dislocation densities at first to third interfaces J1, J2 and J3 are not more than $1 \times 10^6$ cm$^{-1}$, thereby preventing lattice relaxation from occurring in the semiconductor layers at these interfaces J1, J2 and J3 because of the c-plane that acts as a slip plane.

19 Claims, 4 Drawing Sheets

U.S. PATENT DOCUMENTS

2008/0192788 A1 8/2008 Matsuyama et al.

FOREIGN PATENT DOCUMENTS

| EP | 1 670 106 A1 | 6/2006 |
| --- | --- | --- |
| JP | 2001-230497 | 8/2001 |
| JP | 2002-016000 A | 1/2002 |
| JP | 2002-270971 A | 9/2002 |
| JP | 2005-072368 | 3/2005 |
| JP | 2008-533723 T | 8/2008 |
| JP | 2008-311640 A | 12/2008 |
| JP | 2009-054616 | 3/2009 |
| WO | WO-2007/133603 A2 | 11/2007 |
| WO | WO-2008/060531 A2 | 5/2008 |
| WO | WO-2009/048131 A1 | 4/2009 |

* cited by examiner

GALLIUM NITRIDE-BASED SEMICONDUCTOR LASER DIODE

BACKGROUND OF THE INVENTION

1. Field of the Invention

The present invention relates to a gallium nitride (GaN)-based semiconductor laser diode.

2. Related Background Art

Patent Document 1 discloses a Fabry-Pérot type semiconductor laser diode. An n-type semiconductor layer, a light emitting layer and a p-type semiconductor layer are stacked in the m-axis direction. The n-type semiconductor layer includes an n-type GaN cladding layer and an n-type InGaN layer, and the p-type semiconductor layer includes a p-type GaN cladding layer and a p-type InGaN layer. The refractive index difference between the cladding layers and the optical guide layers is 0.04 or more. Patent Document 2 discloses a laser device with the emission wavelength of 425 nm to 450 nm.

Patent Document 1: Japanese Patent Application Laid-open No. 2008-311640

Patent Document 2: Japanese Patent Application Laid-open No. 2002-270971

SUMMARY OF THE INVENTION

What is demanded for a semiconductor laser is to emit light of a wavelength longer than blue, e.g., green light. One of currently available green lasers makes use of second harmonic generation (SHG). This laser diode has a short product lifetime and high power consumption because it uses wavelength conversion from a long-wavelength light to a short-wavelength light of higher energy. What is needed is a green laser diode making no use of this wavelength conversion.

A GaN-based semiconductor light emitting device is a candidate for a semiconductor laser with the lasing wavelength of 500 nm or more. According to the Inventors' investigation, what is important in the laser diode with the lasing wavelength of not less than 500 nm is that light should stand stable in a core semiconductor region including an active layer and guide layers. In the conventional structures of laser diodes with the lasing wavelength of 500 nm or more, light generated in the LED mode does not stand stable in the core semiconductor region.

In Patent Document 1, in order that the refractive index difference between the cladding layers and the optical guide layers is not less than 0.04, the optical guide layers are made of InGaN only. However, according to the Inventors' expertise, when this structure is applied to the laser diode that aims to the lasing wavelength of 500 nm or more, the threshold current density becomes very high, resulting in making practical lasing difficult. On the other hand, this structure is suitable for the ultraviolet laser diodes of about 400 nm, but the refractive index difference between the core semiconductor region and the cladding layers becomes insufficient for the confinement of green light of the lasing wavelength of not less than 500 nm because of chromatic dispersion. The Inventors' investigation finds that, for example, in the lasing wavelength region of not less than 500 nm, the light to be confined in the core semiconductor region has amplitude in the substrate.

When the refractive index difference between the core semiconductor region and the cladding layers is increased to achieve optical confinement, a GaN-based semiconductor layer with low refractive index is grown on the substrate. As the difference between the lattice constant of the substrate and the lattice constant peculiar to the GaN-based semiconductor layer (untrained lattice constant) to be grown on the substrate increases, misfit dislocations are introduced to the GaN-based semiconductor layer that is grown on a semipolar plane of the substrate. Accordingly, when the laser diode is fabricated using the semipolar substrate, the increase in the refractive index difference between the core semiconductor region and the cladding layers results in introducing misfit dislocations into the GaN-based semiconductor layer, even without occurrence of a crack. According to the Inventors' expertise, this introduction of dislocations is caused by inclination of c-plane in the GaN-based semiconductor layer and is different from occurrence of a crack in the GaN-based semiconductor layer grown on the c-plane in the c-axis direction. In growing the GaN-based semiconductor layer on the semipolar plane, the c-plane acts as a slip plane to induce uncontrolled lattice relaxation.

The present invention has been accomplished in view of the circumstances as described above, and it is an object of the present invention to provide a III-nitride semiconductor laser diode capable of lasing to emit light at the wavelength of not less than 500 nm with use of a semipolar plane.

One aspect according to the present invention relates to a GaN-based semiconductor laser diode. The gallium nitride-based semiconductor laser diode comprises: (a) a support base comprised of a III-nitride semiconductor and having a semipolar primary surface that is inclined at an angle ALPHA with respect to a first reference plane perpendicular to the reference axis that extends in a direction of the c-axis of the III-nitride semiconductor; (b) a first epitaxial semiconductor region comprising a first cladding layer and provided on the primary surface of the support base; (c) a second epitaxial semiconductor region comprising a second cladding layer and provided on the primary surface of the support base; and (d) a core semiconductor region provided on the primary surface of the support base. The core semiconductor region comprises a first optical guide layer, an active layer, and a second optical guide layer. The active layer comprises an $In_{X0}Ga_{1-X0}N$ layer. The active layer is provided so as to emit light at a lasing wavelength of not less than 500 nm. The first cladding layer is made of a gallium nitride-based semiconductor different from the III-nitride semiconductor, and the gallium nitride-based semiconductor is comprised of at least either of AlGaN and InAlGaN. The first epitaxial semiconductor region, the core semiconductor region, and the second epitaxial semiconductor region are arranged in order in the direction of a normal axis normal to the semipolar primary surface of the support base. The c-axis is directed in the direction of either of the <0001> axis and the <000-1> axis. The angle ALPHA is in the range of not less than 10 degrees, and less than 80 degrees. The thickness of the first epitaxial semiconductor region is larger than that of the core semiconductor region. The density of misfit dislocations at the first interface between the support base and the first epitaxial semiconductor region is equal to or less than $1 \times 10^6$ cm$^{-1}$. The density of misfit dislocations at the second interface between the first epitaxial semiconductor region and the core semiconductor region is equal to or less than $1 \times 10^6$ cm$^{-1}$. The density of misfit dislocations at the third interface between the core semiconductor region and the second epitaxial semiconductor region is equal to or less than $1 \times 10^6$ cm$^{-1}$. The conductivity type of the first cladding layer is opposite to that of the second cladding layer. The first optical guide layer is provided between the active layer and the first epitaxial semiconductor region. The first optical guide layer comprises a first $In_{X1}Ga_{1-X1}N$ layer and a first GaN layer. The second optical guide layer is provided between the active layer and the second epitaxial semiconductor region. The second optical guide layer comprises a second $In_{x2}Ga_{1-x2}N$ layer and a second GaN layer.

In this GaN-based semiconductor laser diode, since the active layer is provided so as to emit light at the lasing wavelength of not less than 500 nm, the wavelength of the light to be confined into the core semiconductor region is in a long wavelength region. Both the first optical guide layer comprising the first $In_{x1}Ga_{1-x1}N$ layer and the first GaN layer and the second optical guide layer comprising the second $In_{x2}Ga_{1-x2}N$ layer and the second GaN layer are used in order to achieve optical confinement in this wavelength band.

The first cladding layer is made of at least either of AlGaN and InAlGaN. The material of the first cladding layer is different from the III-nitride semiconductor of the support base, and the thickness of the first epitaxial semiconductor region is larger than the thickness of the core semiconductor region, but the misfit dislocation densities at the first to third interfaces are not more than $1\times10^6$ cm$^{-1}$. Accordingly, the GaN-based semiconductor laser diode can prevent lattice relaxation by c-planes acting as a slip plane from occurring in the semiconductor layers at these interfaces. As the optical confinement is achieved into the core semiconductor region, it is feasible to provide the III-nitride semiconductor laser diode capable of lasing with the use of the semipolar plane to emit the light of not less than 500 nm.

In the GaN-based semiconductor laser diode according to the above aspect of the present invention, the sum of thicknesses of the first optical guide layer and the second optical guide layer can be not more than 400 nm.

In this GaN-based semiconductor laser diode, since the sum of the thicknesses of the optical guide layers is equal to or less than 400 nm, the thickness of the core semiconductor region can be made thin in thickness, whereby the threshold current of the laser diode can be reduced.

In the GaN-based semiconductor laser diode according to the above aspect of the present invention, the active layer can be provided so as to generate light at the lasing wavelength of not more than 530 nm. In this GaN-based semiconductor laser diode, the difficulty of obtaining the optical confinement becomes much higher for light of long wavelengths over 530 nm.

In the GaN-based semiconductor laser diode according to the above aspect of the present invention, the indium composition $X0$ of the $In_{x0}Ga_{1-x0}N$ layer in the active layer can be larger than an indium composition $X1$ of the first $In_{x1}Ga_{1-x1}N$ layer in the first optical guide layer, and an indium composition difference $X1-X0$ can be not less than 0.26.

In this GaN-based semiconductor laser diode, the emission of long wavelength requires increase in the indium composition $X0$ of the $In_{x0}Ga_{1-x0}N$ layer, but it is desired to prevent occurrence of lattice relaxation between the optical guide layer and the cladding layer. The laminate of the core semiconductor region that includes relatively thin semiconductor layers can be provided with semiconductor layers having a large indium composition difference $X1-X0$ therebetween, thereby decreasing the lattice mismatch degree at the second interface.

In the GaN-based semiconductor laser diode according to the above aspect of the present invention, the indium composition $X1$ of the first InGaN layer in the first optical guide layer can be not less than 0.01 and not more than 0.05, and the density of misfit dislocations at an interface between the first InGaN layer and the first GaN layer in the first optical guide layer can not more than $1\times10^6$ cm$^{-1}$.

In this GaN-based semiconductor laser diode, the optical guide layer is provided with the double-layered structure constituted by the GaN layer and the InGaN layer, thereby increasing the effective refractive index of the core semiconductor region. The InGaN layer of the optical guide layer is located between the cladding layer and the active layer. Since the optical guide layer includes the InGaN layer in addition to the GaN layer, the misfit dislocation density can be reduced in the optical guide layer so as to avoid lattice relaxation therein.

In the GaN-based semiconductor laser diode according to the above aspect of the present invention, a direction of a c-axis of the III-nitride semiconductor and a magnitude of a lattice constant $d0$ thereof in the c-axis direction are represented by a lattice vector $LVC0$; a direction of a c-axis of a semiconductor material for the first cladding layer in the first epitaxial semiconductor region and a magnitude of a lattice constant $d1$ thereof in the taxis direction are represented by a lattice vector $LVC1$; the lattice vector $LVC0$ has a longitudinal component $V0_L$ in the direction of the normal axis and a transverse component $V0_T$ perpendicular to the longitudinal component; the lattice vector $LVC1$ has a longitudinal component $V1_L$ in the direction of the normal axis and a transverse component $V1_T$ perpendicular to the longitudinal component; and a lattice mismatch degree $(V1_T-V0_T)/V0_T$ in the transverse direction satisfies a lattice matching condition.

In this GaN-based semiconductor laser diode, it is feasible to avoid the lattice relaxation due to the difference between the lattice constant of the support base and the lattice constant (unstrained) inherent to the semiconductor material for the first cladding layer.

In the GaN-based semiconductor laser diode according to the above aspect of the present invention, a direction of a c-axis of a semiconductor material for the first InGaN layer in the first optical guide layer and a magnitude of a lattice constant $d2$ thereof in the c-axis direction are represented by a lattice vector $LVC2$; the lattice vector $LVC2$ has a longitudinal component $V2_L$ in the direction of the normal axis and a transverse component $V2_T$ perpendicular to the longitudinal component; and a value of a lattice mismatch degree $(V2_T-V0_T)/V0_T$ in the transverse direction is in a range satisfying the lattice matching condition.

In this GaN-based semiconductor laser diode, it is feasible to avoid the lattice relaxation due to the difference between the lattice constant of the support base and the lattice constant inherent to the semiconductor material, which is unstrained, for the first $In_{x1}Ga_{1-x1}N$ layer of the first optical guide layer.

In the GaN-based semiconductor laser diode according to the above aspect of the present invention, a direction of a c-axis of a semiconductor material for the second cladding layer in the second epitaxial semiconductor region and a magnitude of lattice constant $d3$ thereof in the c-axis direction are represented by a lattice vector $LVC3$; the lattice vector $LVC3$ has a longitudinal component $V3_L$ in the direction of the normal axis and a transverse component $V3_T$ perpendicular to the longitudinal component; and a lattice mismatch degree $(V3_T-V0_T)/V0_T$ in the transverse direction satisfies the lattice matching condition.

In this GaN-based semiconductor laser diode, it is feasible to avoid the lattice relaxation due to the difference between the lattice constant of the support base and the lattice constant inherent to the semiconductor material, which is unstrained, for the second cladding layer.

In the GaN-based semiconductor laser diode according to the above aspect of the present invention, the first cladding layer is made of an AlGaN layer; an aluminum composition of the AlGaN layer is not more than 0.04; and a thickness of the AlGaN layer is not more than 500 nm. In this GaN-based semiconductor laser diode, since the aluminum composition and the thickness of the AlGaN layer of the first cladding layer become large, it is feasible to avoid the lattice relaxation due to the AlGaN layer of the first cladding layer. Alternatively, in the GaN-based semiconductor laser diode according to the above aspect of the present invention, the first cladding layer is made of an InAlGaN layer, and a bandgap of the InAlGaN layer is larger than a bandgap of the first GaN layer in the optical guide layer. In this GaN-based semiconductor laser diode, since the bandgap of the InAlGaN layer is larger than the bandgap of GaN, the refractive index of this InAlGaN layer can be made higher than the refractive index of GaN. The use of the quaternary GaN-based semiconductor can avoid the lattice relaxation.

In the GaN-based semiconductor laser diode according to the above aspect of the present invention, the angle ALPHA can be not less than 63 degrees and be less than 80 degrees. In this GaN-based semiconductor laser diode, when the angle ALPHA is in the above angular range, the lattice relaxation because of the c-plane acting as a slip plane is likely to occur therein, but excellent indium incorporation is demonstrated in growth of InGaN.

In the GaN-based semiconductor laser diode according to the above aspect of the present invention, the angle ALPHA can be not less than 70 degrees and be less than 80 degrees. In this GaN-based semiconductor laser diode, when the angle ALPHA is in the above angular range, the lattice relaxation is likely to occur therein because the c-plane can act as a slip plane, but excellent indium incorporation and less indium segregation are demonstrated in growth of InGaN.

In the GaN-based semiconductor laser diode according to the above aspect of the present invention, the angle ALPHA can be not less than 72 degrees and be less than 78 degrees. In this GaN-based semiconductor laser diode, when the angle ALPHA is in the above angular range, the lattice relaxation is likely to occur therein because the c-plane can act as a slip plane, but excellent indium incorporation, less indium segregation and excellent morphology are demonstrated in growth of InGaN.

In the GaN-based semiconductor laser diode according to the above aspect of the present invention, the III-nitride semiconductor of the support base can be GaN. This GaN-based semiconductor laser diode can suppress the generation of slip planes on the GaN support base available with excellent crystal quality, to achieve excellent crystal growth.

In the GaN-based semiconductor laser diode according to the above aspect of the present invention, the core semiconductor region can comprise an electron block layer. For example, the electron block layer can be located between the second InGaN layer and the second GaN layer. Alternatively, the electron block layer can be located between the second GaN layer and the second cladding layer. The location of the electron block layer can be controlled to adjust carrier confinement and optical confinement.

In the GaN-based semiconductor laser diode according to the above aspect of the present invention, the reference axis can be inclined toward an a-axis direction. Alternatively, in the GaN-based semiconductor laser diode according to the above aspect of the present invention, the reference axis can be inclined toward an m-axis direction.

The GaN-based semiconductor laser diode according to the above aspect of the present invention can further comprise a pair of end faces constituting an optical cavity for the gallium nitride-based laser diode. A laser stripe for the gallium nitride-based laser diode can extend in a direction perpendicular to both of the reference axis and the normal axis. Alternatively, the GaN-based semiconductor laser diode according to the above aspect of the present invention can further comprise a pair of end faces constituting an optical cavity for the gallium nitride-based laser diode. A laser stripe for the gallium nitride-based laser diode extends along the second reference plane that is defined by the reference axis and the normal axis. In the active layer that is anisotropically strained due to semipolar nature, it is feasible to select a band transition contributing to lasing in accordance with the direction of the laser stripe.

The GaN-based semiconductor laser diode according to the above aspect of the present invention can further comprise an electrode extending along the laser stripe on the second epitaxial semiconductor region. Each of end faces extends from an edge of a back face of the support base to an edge of a front face of the second epitaxial semiconductor region.

In this GaN-based semiconductor laser diode, the optical cavity for lasing can be provided with the excellent end faces by producing a laser bar through formation of scribe marks and separation with a blade or the like.

The foregoing object and other objects, features, and advantages of the present invention will more readily become apparent in view of the following detailed description of the preferred embodiments of the present invention proceeding with reference to the accompanying drawings.

As described above, the above-described aspect provides the III-nitride semiconductor laser diode capable of lasing to emit the light of not less than 500 nm with the use of the semipolar plane.

DETAILED DESCRIPTION OF EMBODIMENTS

The teachings of the present invention can be readily understood in view of the following detailed description with reference to the accompanying drawings presented by way of illustration. The following will describe embodiments of the GaN-based semiconductor laser diode and epitaxial substrate thereof, and fabrication methods thereof. The same portions will be denoted by the same reference symbols, if possible.

Figure 1:
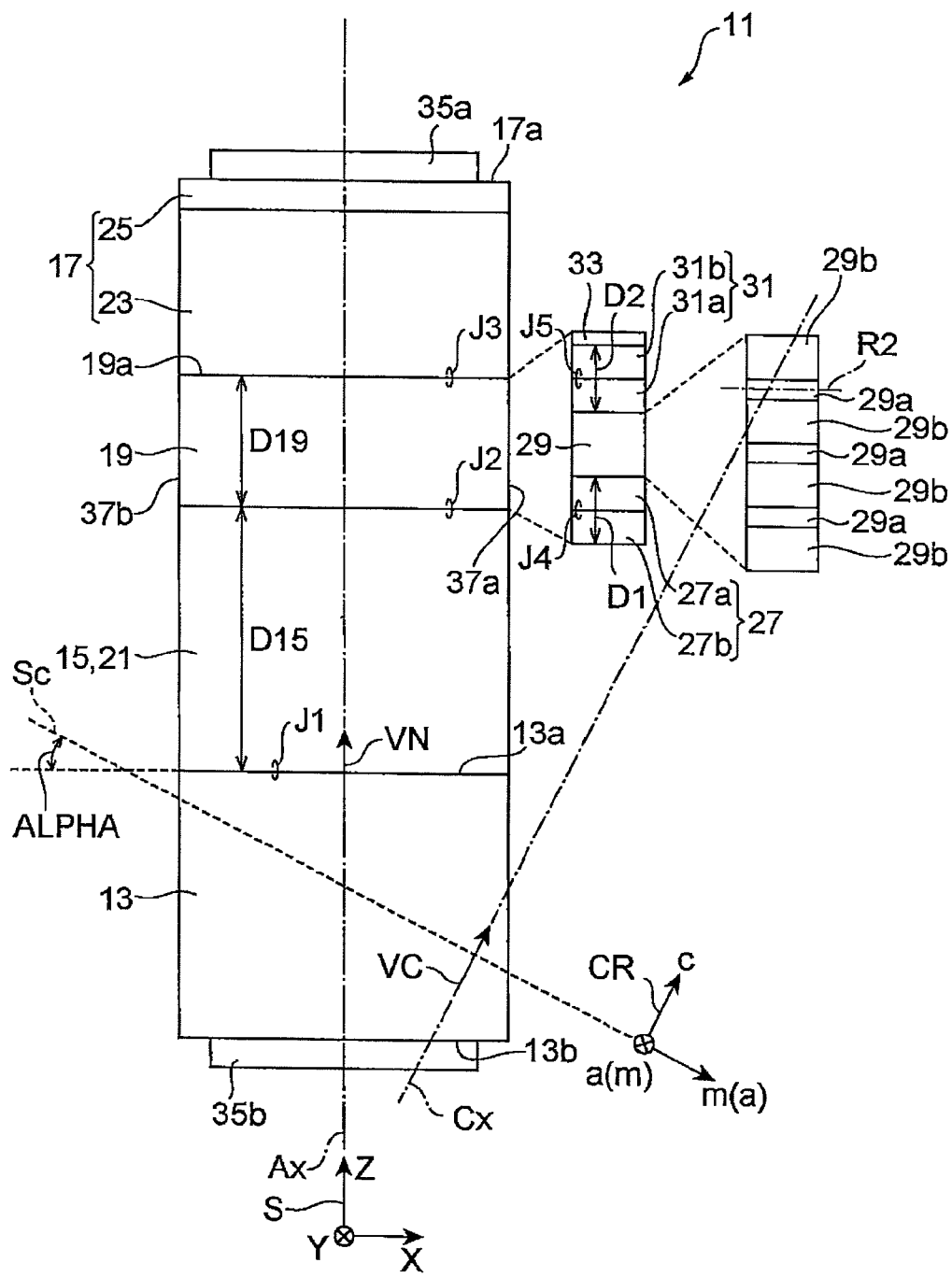
FIG. 1 is a drawing schematically showing a GaN-based semiconductor laser diode according to an embodiment of the present invention.

FIG. 1 is a schematic view showing a GaN-based semiconductor laser diode according to an embodiment of the present invention. With reference to FIG. 1, an orthogonal coordinate system S and a crystal coordinate system CR are depicted.

The GaN-based semiconductor laser diode 11 comprises a support base 13, a first epitaxial semiconductor region 15, a second epitaxial semiconductor region 17, and a core semiconductor region 19. The support base 13 has a semipolar primary surface 13a and a semipolar back surface 13b. This semipolar primary surface 13a is inclined at an angle ALPHA with respect to a first reference plane Sc perpendicular to a reference axis Cx extending in the direction of the c-axis of the III-nitride semiconductor. The reference axis Cx is directed in either direction of the <0001> axis and the <000-1> axis. The direction toward which the reference axis Cx is inclined can be the a-axis direction, or the direction toward which the reference axis Cx is inclined can be the m-axis direction. The angle ALPHA is in the range of not less than 10 degrees, and less than 80 degrees. The thickness of the first epitaxial semiconductor region 15 is larger than the thickness of the core semiconductor region 19. The support base 13 is made of a III-nitride semiconductor, and the III-nitride semiconductor is made of $In_SAl_TGa_{1-S-T}N$ ($0 \leq S \leq 1$, $0 \leq T \leq 1$, $0 \leq S+T < 1$) and encompasses e.g., GaN or the like. The first epitaxial semiconductor region 15; the core semiconductor region 19 and the second epitaxial semiconductor region 17 are provided on the primary surface 13a of the support base 13. The first epitaxial semiconductor region 15 is formed by epitaxial growth onto the primary surface 13a of the support base 13 and is provided so as to cover the entire area of the primary surface 13a of the support base 13. The first epitaxial semiconductor region 15 includes a first cladding layer 21 and, if necessary, it can include a buffer layer, which is located between the first cladding layer 21 and the support base 13. The first cladding layer 21 is made of a GaN-based semiconductor which is different from the III-nitride semiconductor. The GaN-based semiconductor of the first cladding layer 21 can be made of at least either of AlGaN and InAlGaN.

The second epitaxial semiconductor region 17 is formed by epitaxial growth on a primary surface 19a of the core semiconductor region 19, and is provided so as to cover the entire area of the primary surface 19a of the core semiconductor region 19. The second epitaxial semiconductor region 17 includes a second cladding layer 23 and also includes a p-type contact layer 25 in addition to the second cladding layer 23. The conductivity type of the first cladding layer 21 is opposite to that of the second cladding layer 23. The first cladding layer 21 has an n-type, and the second cladding layer 23 has a p-type.

The core semiconductor region 19 includes a first optical guide layer 27, an active layer 29 and a second optical guide layer 31. The active layer 29 can include well layers 29a and bather layers 29b, which are arranged alternately in the direction of a normal axis Ax (direction of the Z-axis of the orthogonal coordinate system S). In the active layer 29, the well layers 29a can comprise a GaN-based semiconductor, e.g., $In_{X0}Ga_{1-X0}N$. The barrier layers 29b can comprise a GaN-based semiconductor, e.g., InGaN, GaN or the like. The active layer 29 is provided so as to generate light at the lasing wavelength that is equal to or more than 500 nm, and can provide emission of a longer wavelength that is equal to or more than the wavelength of green light. Furthermore, the active layer 29 is provided so as to generate light at the lasing wavelength that is equal to or less than 530 nm. The difficulty of confinement of light having a long wavelength over 530 nm is much higher. The well layers 29a extend, for example, along a reference plane R2 that is inclined at an angle of (90-ALPHA) degrees with respect to the reference axis Cx. The well layers 29a include anisotropic strain.

The first epitaxial semiconductor region 15, the core semiconductor region 19 and the second epitaxial semiconductor region 17 are arranged in order in the direction of the axis Ax perpendicular to the semipolar primary surface 13a of the support base 13.

The angle ALPHA can be not less than 63 degrees and be less than 80 degrees. When the angle ALPHA is in this angular range, the lattice relaxation could occur therein with the c-plane that can act as a slip plane, but the surface with the angle ALPHA in this angular range demonstrates an excellent indium-incorporation in growth of InGaN. Further, the angle ALPHA can be not less than 70 degrees and be less than 80 degrees. When the angle ALPHA is in this angular range, the lattice relaxation could occur therein with the c-plane that can act as a slip plane, but the surface with the angle ALPHA in this angular range demonstrates an excellent indium-incor-poration and less indium segregation in the growth of InGaN. Furthermore, the angle ALPHA can be not less than 72 degrees and be less than 78 degrees. When the angle ALPHA is in this angular range, the lattice relaxation could occur therein with the c-plane that can act as a slip plane, but the surface with the angle ALPHA in this angular range demonstrates an excellent indium-incorporation, a less indium segregation, and an excellent surface morphology in the growth of InGaN.

The first optical guide layer 27 is provided between the active layer 29 and the first epitaxial semiconductor region 15. The first optical guide layer 27 includes a first $In_{X1}Ga_{1-X1}N$ layer 27a and a first GaN layer 27b. The second optical guide layer 31 is provided between the active layer 29 and the second epitaxial semiconductor region 17. The second optical guide layer 31 includes a second $In_{X2}Ga_{1-X2}N$ layer 31a and a second GaN layer 31b.

The misfit dislocation density at a first interface J1 between the support base 13 and the first epitaxial semiconductor region 15 is equal to or less than $1 \times 10^6$ cm$^{-1}$. The misfit dislocation density at a second interface J2 between the first epitaxial semiconductor region 15 and the core semiconductor region 19 is equal to or less than $1 \times 10^6$ cm$^{-1}$. The misfit dislocation density at a third interface J3 between the core semiconductor region 19 and the second epitaxial semiconductor region 17 is equal to or less than $1 \times 10^6$ cm$^{-1}$.

In this GaN-based semiconductor laser diode 11, since the active layer 29 is provided so as to generate light at the lasing wavelength of 500 nm or more, the wavelength of light to be confined into the core semiconductor region 19 is in a long wavelength region, and, in order to achieve optical confinement in this wavelength band, the first optical guide layer 27 is provided a double-layered structure, and the second optical guide layer 31 is provided with a double-layered structure. The material of the first cladding layer 21 is at least either of AlGaN and InAlGaN. The material of the first cladding layer 21 is different from the III-nitride semiconductor, and the thickness D15 of the first epitaxial semiconductor region 15 is larger than the thickness D19 of the core semiconductor region 19, but the misfit dislocation densities at the first to third interfaces J1, J2 and J3 are not more than $1 \times 10^6$ cm$^{-1}$. This shows that the GaN-based semiconductor laser diode 11 can prevent the lattice relaxation from occurring in the semiconductor layers at these interfaces J1, J2 and J3 such that c-planes act as a slip plane. Although it has not been easy to achieve optical confinement in the core semiconductor region 19, the III-nitride semiconductor laser diode 11 can demonstrate the lasing to emit the light of not less than 500 nm with the use of the semipolar plane 13a.

The sum (D1+D2) of the thicknesses D1 and D2 of the first and second optical guide layers 27 and 31 can be equal to or less than 400 nm. Since the sum of the thicknesses of the optical guide layers is not more than 400 nm, the thickness D19 of the core semiconductor region 19 can be made thin in thickness, which improves the optical confinement and allows reduction in the threshold current of the laser diode.

The indium composition X0 of the $In_{X0}Ga_{1-X0}N$ layers 29a in the active layer 29 is larger than the indium composition X1 of the first $In_{X1}Ga_{1-X1}N$ layer 27b in the first optical guide layer 27, and the indium composition difference X1−X0 can be equal to or more than 0.26. The emission of the long wavelength requires increase in the indium composition X0 of the $In_{X0}Ga_{1-X0}N$ layers 29a. On the other hand, it is desired to prevent occurrence of lattice relaxation between the optical guide layer 27 and the cladding layer 21. For this reason, the semiconductor layers with the large indium composition difference X1−X0 are provided in the core semiconductor region 19, which includes the laminate of relatively thin semiconductor layers, so as to reduce the lattice mismatch degree at the second interface J2.

The indium composition X1 of the first InGaN layer 27b in the first optical guide layer 27 can be not less than 0.01 and not more than 0.05. The misfit dislocation density at an interface J4 between the first InGaN layer 27b and the first GaN layer 27a in the first optical guide layer 27 can be not more than $1 \times 10^6$ cm$^{-1}$.

When the optical guide layer 27 is provided with the two-layer structure constituted by the GaN layer and the InGaN layer, the effective refractive index of the core semiconductor region 19 can be increased. The InGaN layer 27a of the optical guide layer 27 is located between the cladding layer 21 and the active layer 29. Since the optical guide layer 27 includes the InGaN layer in addition to the GaN layer, the misfit dislocation density in the optical guide layer 27 can be reduced so as to avoid the lattice relaxation in the optical guide layer 27.

The indium composition X0 of the $In_{X0}Ga_{1-X0}N$ layers 29a in the active layer 29 is larger than the indium composition X2 of the second $In_{X2}Ga_{1-X2}N$ layer 31a in the second optical guide layer 31, and the indium composition difference X2−X0 can be equal to or more than 0.26. The emission of long wavelength requires increase in the indium composition X0 of the $In_{X0}Ga_{1-X0}N$ layers 29a. On the other hand, it is desired to prevent occurrence of lattice relaxation between the optical guide layer 31 and the cladding layer 23. For this reason, the semiconductor layers with the large indium composition difference X2−X0 are provided in the core semiconductor region 19, which includes the laminate of relatively thin semiconductor layers, so as to decrease the lattice mismatch degree at the third interface J3.

The indium composition X2 of the second InGaN layer 31a in the second optical guide layer 31 can be not less than 0.01 and not more than 0.05. The misfit dislocation density at an interface J5 between the second InGaN layer 31a and the second GaN layer 31b in the second optical guide layer 31 can be not more than $1 \times 10^6$ cm$^{-1}$. When the optical guide layer 31 is provided with the two-layer structure constituted by the GaN layer and the InGaN layer, the effective refractive index of the core semiconductor region 19 can be increased. The InGaN layer of the optical guide layer 31 is located between the cladding layer 23 and the active layer 29. Since the optical guide layer 31 includes the InGaN layer in addition to the GaN layer, the misfit dislocation density of the optical guide layer 31 can be reduced so as to avoid the lattice relaxation in the optical guide layer 31.

The GaN-based semiconductor laser diode 11 can be further provided with an electrode (e.g., anode) 35a, which extends along the laser stripe, on the second epitaxial semiconductor region 17. An electrode (e.g., cathode) 35b can be provided on the back surface 13b of the support base 13.

The GaN-based semiconductor laser diode can be further provided with a pair of end faces 37a, 37b which form an optical cavity for the GaN-based semiconductor laser diode. The end faces 37a and 37b are located at the two ends of the laser stripe, respectively. Each of the pair of end faces 37a and 37b satisfies both of flatness and perpendicularity necessary for the laser optical cavity. Each of the end faces 37a and 37b extends from an edge of the back surface 13b of the support base 13 to an edge of a front surface 17a of the second epitaxial semiconductor region 17.

Such an optical cavity enabling lasing, i.e., the excellent end faces 37a and 37b can be obtained by producing a laser bar through the formation of scribe marks and the separation with a blade or the like. The laser stripe for the GaN-based semiconductor laser diode 11 can extend in the direction that is perpendicular to both of the reference axis Cx and the normal axis Ax. Alternatively, the laser stripe for the GaN-based semiconductor laser diode 11 extends in a reference plane defined by the reference axis Cx and the normal axis Ax. This reference plane intersects with the end faces 37a and 37b and is preferably substantially perpendicular thereto. In the active layer 29 involving anisotropic strain because of the semipolar nature, it is feasible to select a band transition contributing to the lasing in accordance with the direction of the laser stripe.

The first cladding layer 21 can be made of an AlGaN layer. The aluminum composition of this AlGaN can be not less than 0.01 and not more than 0.04. The thickness of this first cladding layer 21 is not more than 500 nm. Since the aluminum composition and thickness of the first cladding layer 21 become large, it is feasible to avoid the lattice relaxation due to the AlGaN layer of the first cladding layer 21. Alternatively, the first cladding layer 21 is made of an InAlGaN layer and the bandgap of this InAlGaN layer is larger than the bandgap of the first GaN layer 27b of the optical guide layer 27. The thickness of this first cladding layer 21 is not more than 500 nm. Since the bandgap of this InAlGaN layer is larger than the bandgap of GaN, the refractive index of this InAlGaN layer can be made lower than that of GaN. The use of the quaternary GaN-based semiconductor can avoid the lattice relaxation therein.

The second cladding layer 23 can be composed of an AlGaN layer. The aluminum composition of this AlGaN can be not less than 0.01 and not more than 0.04. The thickness of this second cladding layer 23 is not more than 500 nm. Since the aluminum composition and thickness of the second cladding layer 23 become large, it is feasible to avoid the lattice relaxation due to the AlGaN layer of the second cladding layer 23. Alternatively, the second cladding layer 23 is composed of an InAlGaN layer and the bandgap of this InAlGaN layer is larger than the bandgap of the second GaN layer 31b of the optical guide layer 31. The thickness of this second cladding layer 23 is not more than 500 nm. Since the bandgap of this InAlGaN layer is larger than that of GaN, the refractive index of this InAlGaN layer can be made lower than that of GaN.

The core semiconductor region 19 can include an electron block layer 33. The electron block layer 33 is located, for example, between the optical guide layer 31 and the second epitaxial region 17. The electron block layer 33 can be located between the second InGaN layer and the second GaN layer, if necessary. Furthermore, the location of the electron block layer can be controlled so as to adjust the carrier confinement and the optical confinement.

Figure 2:
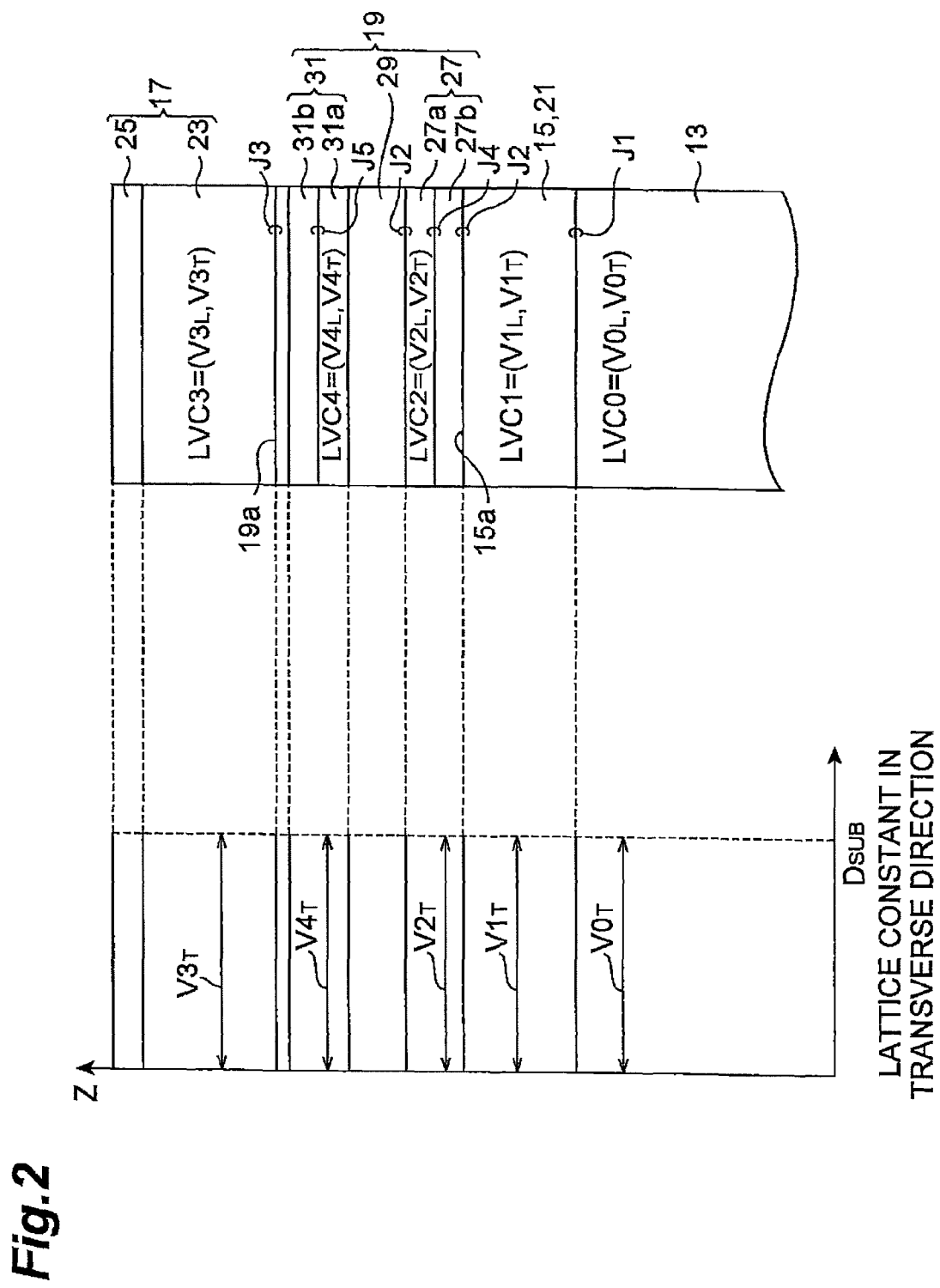
FIG. 2 is a drawing showing the lattice constants in the GaN-based semiconductor laser diode according to the embodiment.

FIG. 2 is a schematic view showing the lattice constants in the GaN-based semiconductor laser diode according to the present embodiment. The semiconductor layers grown on the support base 13 match with the lattice constant of the support base 13 represented by "DSUB" under the lattice matching condition described below. The c-axis direction of the support base 13 and the magnitude of the lattice constant d0 inherent to the III-nitride semiconductor, (i.e., unstrained), in the c-axis direction are represented by a lattice vector LVC0. The lattice vector LVC0 has a longitudinal component V0$_L$ in the direction of the normal axis Ax and a transverse component V0$_T$ perpendicular to this longitudinal component. The c-axis direction of semiconductor material for the first cladding layer 21 and the magnitude of the lattice constant d1 inherent to the semiconductor material, (i.e., unstrained), in the c-axis direction are represented by a lattice vector LVC1. The lattice vector LVC1 has a longitudinal component V1$_L$ in the direction of the normal axis Ax and a transverse component $V1_T$ perpendicular to this longitudinal component. The lattice mismatch degree F10 in the transverse direction is represented by:

$$(V1_T - V0_T)/V0_T,$$

and the lattice mismatch degree F10 satisfies the lattice matching condition. The lattice matching condition is, for example, as follows:

$$-0.001 \leq F10 \leq 0.001.$$

With this GaN-based semiconductor laser diode 11, it is feasible to avoid the lattice relaxation due to the difference between the lattice constant of the support base 13 and the lattice constant inherent to the semiconductor material for the first cladding layer 21.

The c-axis direction of semiconductor material for the first InGaN layer 27a of the first optical guide layer 27 and the magnitude of the lattice constant d2 inherent to the semiconductor material, (i.e., unstrained), in the c-axis direction are represented by a lattice vector LVC2. The lattice vector LVC2 has a longitudinal component $V2_L$ in the direction of the normal axis Ax and a transverse component $V2_T$ perpendicular to the longitudinal component. The lattice mismatch degree F20 in the transverse direction is represented by:

$$(V2_T - V0_T)/V0_T.$$

This lattice mismatch degree F20 satisfies the lattice matching condition. The lattice matching condition is, for example, as follows:

$$-0.001 \leq F20 \leq 0.001.$$

With this GaN-based semiconductor laser diode 11, it is feasible to avoid the lattice relaxation due to the difference between the lattice constant of the support base 13 and the lattice constant inherent to the semiconductor material, (i.e., unstrained), for the $In_{X1}Ga_{1-X1}N$ layer 27a.

The c-axis direction of semiconductor material for the second cladding layer 23 in the second epitaxial semiconductor region 17 and the magnitude of the lattice constant d3 inherent to the semiconductor material, (i.e., unstrained), in the c-axis direction are represented by a lattice vector LVC3. The lattice vector LVC3 has a longitudinal component $V3_L$ in the direction of the normal axis Ax and a transverse component $V3_T$ perpendicular to the longitudinal component. The lattice mismatch degree F30 in the transverse direction is represented by:

$$(V3_T - V0_T)/V0_T.$$

The lattice mismatch degree F30 in the transverse direction satisfies the lattice matching condition. The lattice matching condition is, for example, as follows:

$$-0.001 \leq F30 \leq 0.001.$$

With this GaN-based semiconductor laser diode 11, it is feasible to avoid the lattice relaxation due to the difference between the lattice constant of the support base 13 and the lattice constant inherent to the semiconductor material, (i.e., unstrained), for the second cladding layer 23.

The c-axis direction of the semiconductor material for the second InGaN layer 31a of the second optical guide layer 31 and the magnitude of the lattice constant d4 inherent to the semiconductor material, (i.e., unstrained), in the c-axis direction are represented by a lattice vector LVC4. The lattice vector LVC4 has a longitudinal component $V4_L$ in the direction of the normal axis Ax and a transverse component $V5_T$ perpendicular to this longitudinal component. The lattice mismatch degree F40 in the transverse direction is represented by:

$$(V4_T - V0_T)/V0_T.$$

This lattice mismatch degree F40 satisfies the lattice matching condition. The lattice matching condition is for example as follows:

$$-0.001 \leq F40 \leq 0.001.$$

With this GaN-based semiconductor laser diode 11, it is feasible to avoid the lattice relaxation due to the difference between the lattice constant of the support base 13 and the lattice constant inherent to the semiconductor material, (i.e., unstained), for the second $In_{X2}Ga_{1-X2}N$ layer 31a.

EXAMPLE

Figure 3:
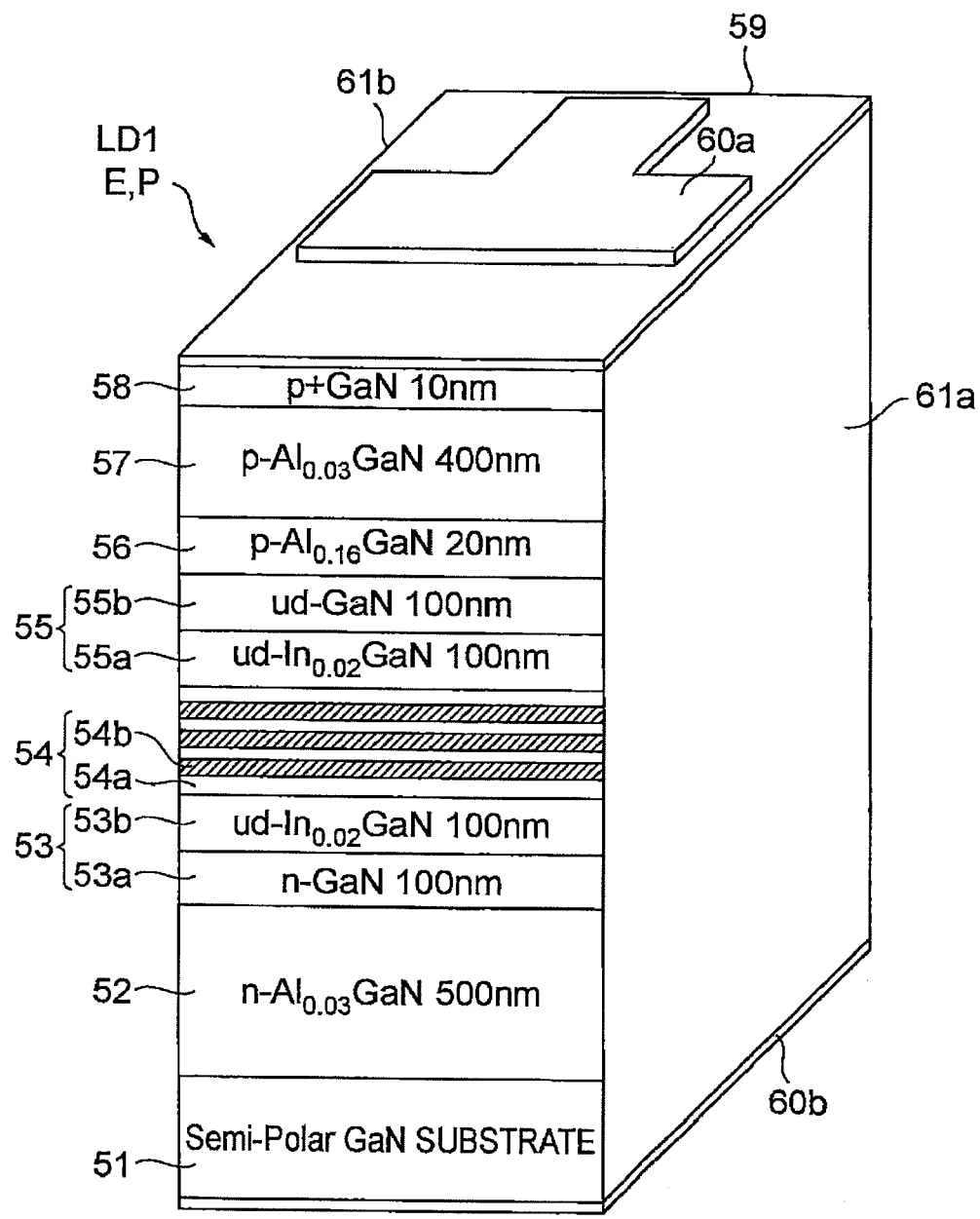
FIG. 3 is a drawing schematically showing a structure of a laser diode according to an example of the present invention.

An epitaxial substrate of a laser diode structure (LD1) is fabricated on a GaN substrate having a semipolar primary surface. FIG. 3 is a schematic view showing the structure of the laser diode according to the present example. Raw materials used for epitaxial growth herein are as follows: trimethyl gallium (TMG); trimethyl indium (TMI); trimethyl aluminum (TMA); ammonia ($NH_3$); silane ($SiH_4$); and bis(cyclopentadienyl) magnesium ($Cp_2Mg$).

The GaN substrate prepared is provided with the inclination angle in an inclination angle ranging from 63 degrees to less than 80 degrees. The GaN substrate has the primary surface tilting at an angle of 75 degrees with respect to a plane perpendicular to the c-axis of hexagonal GaN toward the direction of the m-axis thereof, and this tilt surface is represented by (20-21) plane and tilts at the angle of 75 degrees toward the m-axis direction. This primary surface is also mirror-polished. Epitaxial growth is carried out onto this substrate under the conditions described below.

First, the GaN substrate 51 is set in a growth reactor. The substrate is thermally treated at a temperature of 1050° C. under flow of ammonia and hydrogen for ten minutes. By surface modification based on this thermal treatment, a terrace structure associated with the off angle is formed over the surface 51a of the GaN substrate 51. After this thermal treatment, a GaN-based semiconductor region is grown thereon. For example, TMG, TMA, ammonia and silane are supplied to the growth reactor at 1100° C. to grow an n-type cladding layer 52 thereon. The n-type cladding layer 52 is composed of, for example, a Si-doped AlGaN layer. The thickness of the AlGaN layer is, for example, 500 μm, and the Al composition thereof is, for example, 0.03.

Next, TMG, TMI and ammonia are supplied to the growth reactor at the substrate temperature of 870° C. to grow an optical guide layer 53 on the n-type cladding layer 52. In the growth of the optical guide layer 53, for example, an n-type GaN layer 53a is grown thereon, and the thickness thereof is 100 nm. Subsequently, for example, an undoped InGaN layer 53b is grown on the n-type GaN layer 53a, and the thickness thereof is 100 nm. The indium composition of this InGaN is, for example, 0.02.

Next, an active layer 54 is grown on the optical guide layer 53. TMG and $NH_3$ are supplied to the growth reactor at the substrate temperature of 870° C. to grow a GaN-based semiconductor barrier layer 54a at the bather layer growth temperature. The bather layer 54a is made of, for example, undoped GaN, and the thickness thereof is 15 nm. After the growth of the bather layer 54a, the growth is interrupted, and then the substrate temperature is changed from 870° C. to 830° C. At the well layer growth temperature after the temperature has been changed, TMG, TMI and NH$_3$ are supplied to the growth reactor to grow an undoped InGaN well layer 54b. The thickness thereof is 3 nm. After the growth of the well layer 54b, the supply of TMI is stopped and while TMG and ammonia are supplied to the growth reactor, the substrate temperature is changed from 830° C. to 870° C. During this temperature change, a part of undoped GaN bather layer 54a is also grown. After completion of the change in temperature, the remaining part of the undoped GaN barrier layer 54a is grown continuously. The thickness of the GaN bather layer 54a is 15 nm. Subsequently, the growth of barrier layer 54a, the temperature change, and the growth of well layer 54b are repeatedly carried out to form the InGaN well layers 54b and the GaN bather layers 54a. The indium composition of the InGaN well layers 54b is, for example, 0.3.

An optical guide layer 55 is grown on the active layer 54. In the growth of the optical guide layer 55, TMG, TMI and ammonia are supplied to the growth reactor at the substrate temperature of 870° C. to grow, for example, an undoped InGaN layer 55a thereon. The thickness of this layer is 100 nm, and the indium (In) composition thereof is 0.02. Subsequently, for example, a p-type GaN layer 55b is grown on this InGaN layer 55a, and the thickness thereof is 100 nm.

A GaN-based semiconductor region is grown on the optical guide layer 55. After the growth of the optical guide layer 55, the supply of TMG and TMI is stopped, and the substrate temperature is raised to 1100° C. At this temperature, TMG, TMA, ammonia and bis(cyclopentadienyl) magnesium are supplied to the growth reactor to grow an electron block layer 56 and a p-type cladding layer 57 thereon. The electron block layer 56 is made of, for example, AlGaN. The thickness of the electron block layer 56 is, for example, 20 nm, and the Al composition thereof is 0.16. The p-type cladding layer 57 is made of, for example, AlGaN. The thickness of the p-type cladding layer 57 is, for example, 400 nm, and the Al composition thereof is 0.03. There after, the supply of TMA is stopped, and a p-type contact layer 58 is grown thereon. The p-type contact layer 58 is made of, for example, GaN, and the thickness thereof is, for example, 50 nm. After the film formation, the temperature of the growth reactor is decreased to room temperature, thus obtaining an epitaxial substrate E.

Electrodes are formed on this epitaxial substrate E. First, an insulating film 59 such as a silicon oxide film is deposited thereon, and a contact window is formed in this insulating film 59 through photolithography and etching. The contact window has, for example, a stripe shape, and the width thereof is, for example, 10 μm. Next, a p-electrode (Ni/Au) 60a is formed on the p-type GaN contact layer 58. Thereafter, a p-pad electrode (Ti/Au) is formed thereon. An n-electrode (Ti/Al) 60b is formed on a back surface of the epitaxial substrate. Electrode annealing (e.g., at 550° C. for one minute) is carried out to obtain a substrate product as the result of the above procedure.

This substrate product P is scribed at intervals of 400 μm, and a laser bar is formed from the substrate product using a separating device like a blade. The scribing process is carried out, for example, with a laser scriber. The end faces 61a and 61b of the laser bar have flatness and perpendicularity enough to be applicable to the laser optical cavity. When an electric current is applied across the anode and the cathode, the laser diode generates a laser beam having the lasing wavelength of 500 nm. The threshold current is 60 kA/cm$^2$.

Figure 4:
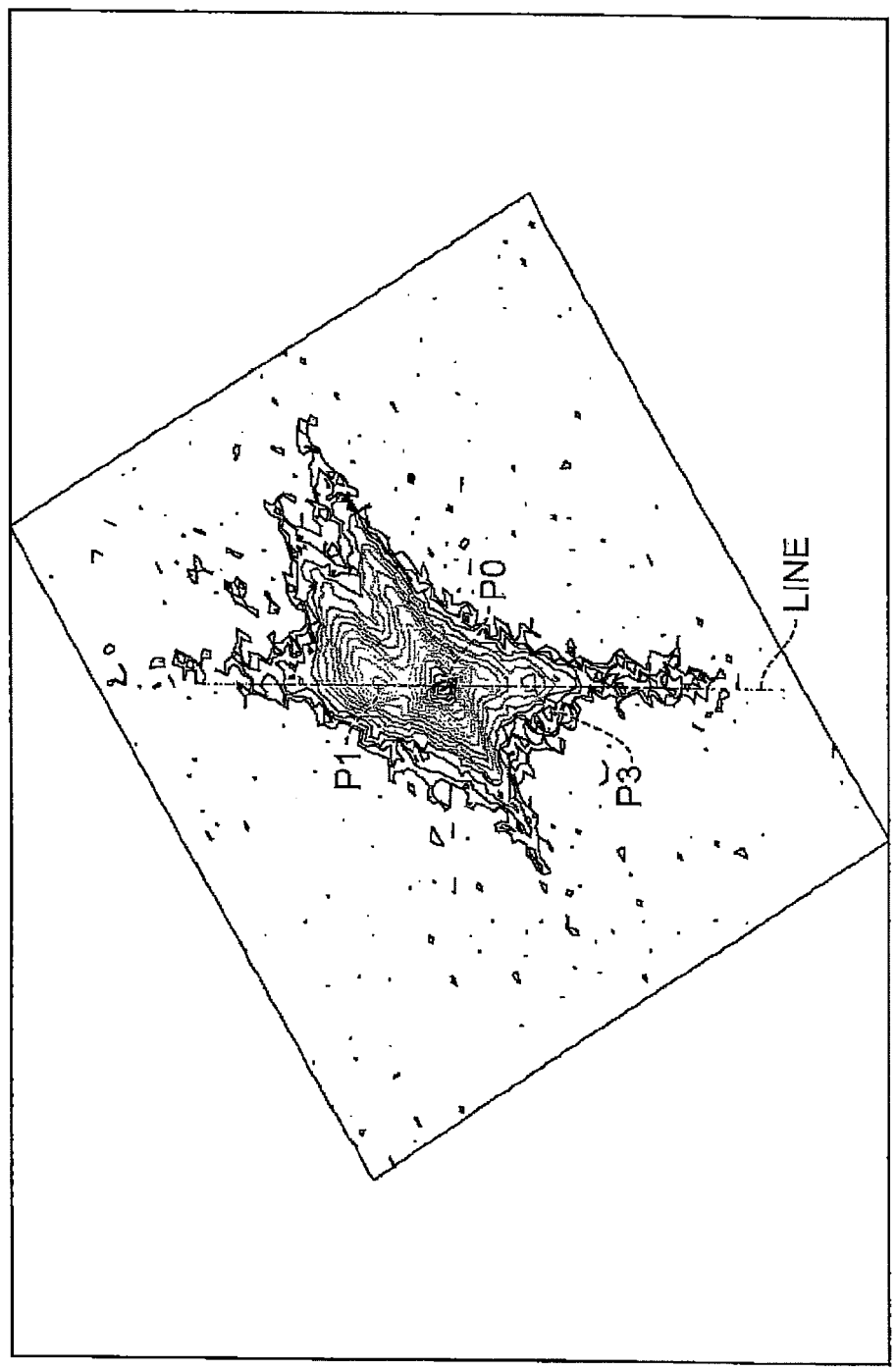
FIG. 4 is a drawing showing a reciprocal lattice mapping chart by X-ray diffraction of an epitaxial substrate E.

FIG. 4 is a chart showing a reciprocal lattice mapping of the epitaxial substrate E by X-ray diffraction measurement. The vertical axis represents the lattice constant in the lamination direction of the semiconductor laminate that the epitaxial substrate E includes, and the horizontal axis represents the lattice constant in the in-plane direction perpendicular to the lamination direction of the semiconductor laminate. With reference to FIG. 4, peak values P0, P1, and P3 of signal intensity are arranged on a line LINE perpendicular to the vertical axis. This arrangement shows that the semiconductor layers have the same lattice constant in the longitudinal direction.

As described above, the present embodiment provides the III-nitride semiconductor laser diode capable of lasing to emit the light of not less than 500 nm with the use of the semipolar plane.

Having illustrated and explained the principle of the present invention in the preferred embodiments, but it is recognized by those skilled in the art that the present invention can be modified in arrangement and in detail without departing from the principle. The present invention is limited to the specific configurations disclosed in the embodiments. Therefore, the applicant claims all modifications and changes falling within the scope of claims and coming from the scope of spirit thereof.

What is claimed is:

1. A gallium nitride-based semiconductor laser diode comprising:
 a support base of a III-nitride semiconductor, the support base having a semipolar primary surface, the semipolar primary surface tilting at an angle ALPHA with respect to a first reference plane, the first reference plane being perpendicular to a reference axis, the reference axis extending in a direction of a c-axis of the III-nitride semiconductor;
 a first epitaxial semiconductor region comprising a first cladding layer and provided on the semipolar primary surface of the support base;
 a second epitaxial semiconductor region comprising a second cladding layer and provided on the semipolar primary surface of the support base; and
 a core semiconductor region provided on the semipolar primary surface of the support base,
 the core semiconductor region comprising a first optical guide layer, an active layer and a second optical guide layer,
 the active layer comprising an In$_{X0}$Ga$_{1-X0}$N layer,
 the active layer being provided so as to emit light at a lasing wavelength of not less than 500 nm,
 the first cladding layer comprising a gallium nitride-based semiconductor different from the III-nitride semiconductor, and material of the gallium nitride-based semiconductor being at least one of AlGaN and InAlGaN,
 the first epitaxial semiconductor region, the core semiconductor region and the second epitaxial semiconductor region being arranged in order in a direction of a normal axis normal to the semipolar primary surface of the support base,
 the c-axis being directed in a direction of either of <0001>axis and <000-1>axis,
 the angle ALPHA being in a range of not less than 10 degrees and less than 80 degrees,
 a thickness of the first epitaxial semiconductor region being larger than a thickness of the core semiconductor region,
 a density of misfit dislocations at an interface between the support base and the first epitaxial semiconductor region being not more than 1×10$^6$ cm$^{-1}$,
 a density of misfit dislocations at an interface between the first epitaxial semiconductor region and the core semiconductor region being not more than 1×10$^6$ cm$^{-1}$, a density of misfit dislocations at an interface between the core semiconductor region and the second epitaxial semiconductor region being not more than $1\times10^6$ cm$^{-1}$, a conductivity type of the first cladding layer being opposite to that of the second cladding layer, the first optical guide layer being provided between the active layer and the first epitaxial semiconductor region, the first optical guide layer comprising a first In$_{X1}$Ga$_{1-X1}$N layer and a first GaN layer, the second optical guide layer being provided between the active layer and the second epitaxial semiconductor region, and the second optical guide layer comprising a second In$_{X2}$Ga$_{1-X2}$N layer and a second GaN layer, wherein a direction of the c-axis of the III-nitride semiconductor and a magnitude of a lattice constant d0 thereof in the direction of the c-axis are represented by a lattice vector LVC0, wherein a direction of a c-axis of a semiconductor material of the first cladding layer in the first epitaxial semiconductor region and a magnitude of a lattice constant d1 thereof in the direction of the c-axis are represented by a lattice vector LVC1, wherein the lattice vector LVC0 is constituted by a longitudinal component V0$_L$ in the direction of the normal axis and a transverse component V0$_T$ perpendicular to the longitudinal component, wherein the lattice vector LVC1 is constituted by a longitudinal component V1$_L$ in the direction of the normal axis and a transverse component V1$_T$ perpendicular to the longitudinal component, and wherein a lattice mismatch degree (V1$_T$–V0$_T$)/V0$_T$ in the transverse direction satisfies a lattice matching condition.

2. The gallium nitride-based semiconductor laser diode according to claim 1, wherein the sum of thicknesses of the first optical guide layer and the second optical guide layer is not more than 400 nm.

3. The gallium nitride-based semiconductor laser diode according to claim 1, wherein the active layer is provided so as to generate light at the lasing wavelength of not more than 530 nm.

4. The gallium nitride-based semiconductor laser diode according to claim 1, wherein an indium composition X0 of the In$_{X0}$Ga$_{1-X0}$N layer in the active layer is larger than an indium composition X1 of the first In$_{X1}$Ga$_{1-X1}$N layer in the first optical guide layer, and wherein difference X0-X1 in an indium composition is not less than 0.26.

5. The gallium nitride-based semiconductor laser diode according to claim 1, wherein an indium composition X1 of the first In$_{X1}$Ga$_{1-X1}$N layer in the first optical guide layer is equal to or more than 0.01, and equal to or less than 0.05, and wherein a density of misfit dislocations at an interface between the first In$_{X1}$Ga$_{1-X1}$N layer and the first GaN layer in the first optical guide layer is not more than $1\times10^6$ cm$^{-1}$.

6. The gallium nitride-based semiconductor laser diode according to claim 1, wherein a c-axis direction of a semiconductor material of the first In$_{X1}$Ga$_{1-X1}$N layer in the first optical guide layer and a magnitude of a lattice constant d2 thereof in the direction of the c-axis are represented by a lattice vector LVC2, wherein the lattice vector LVC2 is constituted by a longitudinal component V2$_L$ in the direction of the normal axis and a transverse component V2$_T$ perpendicular to the longitudinal component, and wherein a value of a lattice mismatch degree (V2$_T$–V0$_T$)/V0$_T$ in the transverse direction is in a range satisfying a lattice matching condition.

7. The gallium nitride-based semiconductor laser diode according to claim 6, wherein a direction of a c-axis of a semiconductor material of the second cladding layer in the second epitaxial semiconductor region and a magnitude of a lattice constant d3 thereof in the direction of the c-axis are represented by a lattice vector LVC3, wherein the lattice vector LVC3 is constituted by a longitudinal component V3$_L$ in the direction of the normal axis and a transverse component V3$_T$ perpendicular to the longitudinal component, and wherein a lattice mismatch degree (V3$_T$–V0$_T$)/V0$_T$ in the transverse direction satisfies a lattice matching condition.

8. The gallium nitride-based semiconductor laser diode according to claim 1, wherein the first cladding layer is made of an AlGaN layer, wherein an aluminum composition of the AlGaN layer is equal to or less than 0.04, and wherein a thickness of the AlGaN layer is equal to or less than 500 nm.

9. The gallium nitride-based semiconductor laser diode according to claim 1, wherein the first cladding layer is made of an InAlGaN layer, and wherein a bandgap of the InAlGaN layer is larger than a bandgap of the first GaN layer in the optical guide layer.

10. The gallium nitride-based semiconductor laser diode according to claim 1, wherein the angle ALPHA is equal to or more than 63 degrees, and is less than 80 degrees.

11. The gallium nitride-based semiconductor laser diode according to claim 1, wherein the angle ALPHA is equal to or more than 70 degrees and is less than 80 degrees.

12. The gallium nitride-based semiconductor laser diode according to claim 1, wherein the angle ALPHA is equal to or more than 72 degrees and is less than 78 degrees.

13. The gallium nitride-based semiconductor laser diode according to claim 1, wherein the III-nitride semiconductor of the support base is GaN.

14. The gallium nitride-based semiconductor laser diode according to claim 1, wherein the core semiconductor region comprises an electron block layer.

15. The gallium nitride-based semiconductor laser diode according to claim 1, wherein the reference axis is inclined toward an a-axis direction of the III-nitride semiconductor.

16. The gallium nitride-based semiconductor laser diode according to claim 1, wherein the reference axis is inclined toward an m-axis direction of the III-nitride semiconductor.

17. The gallium nitride-based semiconductor laser diode according to claim 1, further comprising a pair of end faces, the pair of end faces constituting an optical cavity for the gallium nitride-based laser diode, and a laser stripe for the gallium nitride-based laser diode extending in a direction perpendicular to both of the reference axis and the normal axis.

18. The gallium nitride-based semiconductor laser diode according to claim 1, further comprising a pair of end faces, the pair of end faces constituting an optical cavity for the gallium nitride-based laser diode, and a laser stripe of the gallium nitride-based laser diode extending along a second reference plane defined by the reference axis and the normal axis.

19. The gallium nitride-based semiconductor laser diode according to claim 17, further comprising an electrode, the electrode extending along the laser stripe on the second epitaxial semiconductor region, and each of the pair of end faces extending from an edge of a back surface of the support base to an edge of a front surface of the second epitaxial semiconductor region.

* * * * *